(12) United States Patent
D'Arrigo

(10) Patent No.: US 7,841,320 B2
(45) Date of Patent: Nov. 30, 2010

(54) ACTUATOR UNIT AND METHOD FOR MANUFACTURING AN ACTUATOR UNIT

(75) Inventor: Angelo D'Arrigo, Rosignano Solvay (IT)

(73) Assignee: Continental Automotive Italy S.p.A., Fauglia Pisa (IT)

( * ) Notice: Subject to any disclaimer, the term of this patent is extended or adjusted under 35 U.S.C. 154(b) by 127 days.

(21) Appl. No.: 10/596,694

(22) PCT Filed: Nov. 16, 2004

(86) PCT No.: PCT/EP2004/052978

§ 371 (c)(1), (2), (4) Date: Jun. 20, 2007

(87) PCT Pub. No.: WO2005/062395

PCT Pub. Date: Jul. 7, 2005

(65) Prior Publication Data

US 2007/0252474 A1 Nov. 1, 2007

(30) Foreign Application Priority Data

Dec. 22, 2003 (EP) .................................. 03029640

(51) Int. Cl.
*F02M 37/04* (2006.01)
(52) U.S. Cl. ........................ 123/498; 310/311; 29/25.35
(58) Field of Classification Search ................. 310/311; 29/25.35; 123/498
See application file for complete search history.

(56) References Cited

U.S. PATENT DOCUMENTS

| | | | | |
|---|---|---|---|---|
| 6,051,138 A | * | 4/2000 | Hobson, Jr. ............... | 210/323.2 |
| 6,326,717 B1 | * | 12/2001 | Mattes ....................... | 310/328 |
| 6,499,471 B2 | * | 12/2002 | Shen et al. ................... | 123/498 |
| 6,681,462 B1 | | 1/2004 | Frank et al. ................. | 29/25.35 |
| 6,984,924 B1 | * | 1/2006 | Voigt et al. .................. | 310/348 |
| 6,998,761 B1 | | 2/2006 | Frank et al. ................. | 310/328 |
| 2002/0056768 A1 | * | 5/2002 | Czimmek ................ | 239/585.1 |

FOREIGN PATENT DOCUMENTS

WO 99/08330 12/1999
WO 00/08353 2/2000

OTHER PUBLICATIONS

International Search Report and the Written Opinion of the International Searching Authority, or the Declarartion for Application No. PCT/EP2004/052978, 10 pages, Jan. 13, 2005.

* cited by examiner

*Primary Examiner*—Walter Benson
*Assistant Examiner*—Bryan P Gordon
(74) *Attorney, Agent, or Firm*—King & Spalding L.L.P.

(57) ABSTRACT

An actuator unit has a tube spring (32), a piezoelectric actuator (31), that is inserted into the tube spring (32), a first cap (33), that is connected to the tube spring (32) at a first free end of the tube spring (32) and which is adjoined by the piezoelectric actuator (31), a tube-shaped body 38, that is connected to the tube spring (32) by joining and is arranged in the area of a second free end (35) of the tube spring (32), and a device for pretensioning, that is supported by the tube-shaped body (38) and pretensions the piezoelectric actuator (31). The actuator unit is simple and cheap to manufacture.

12 Claims, 3 Drawing Sheets

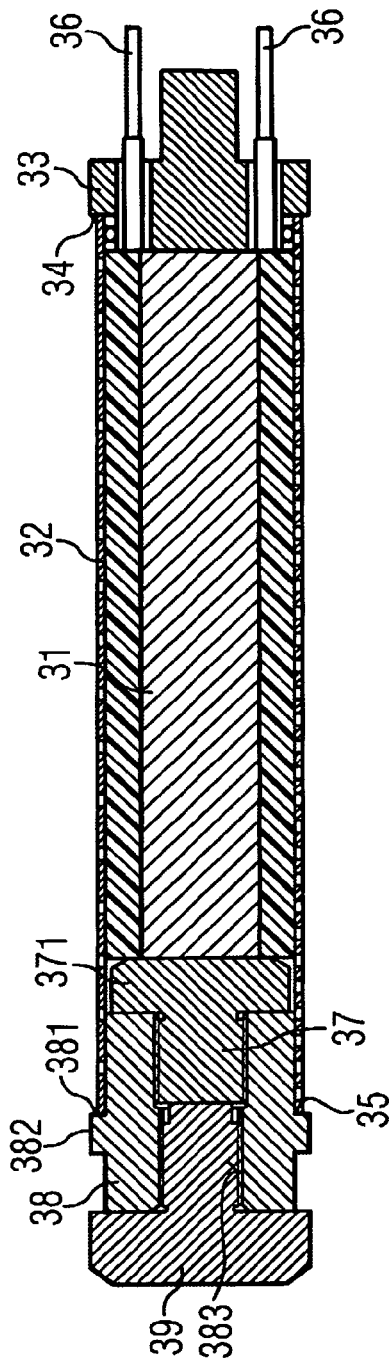
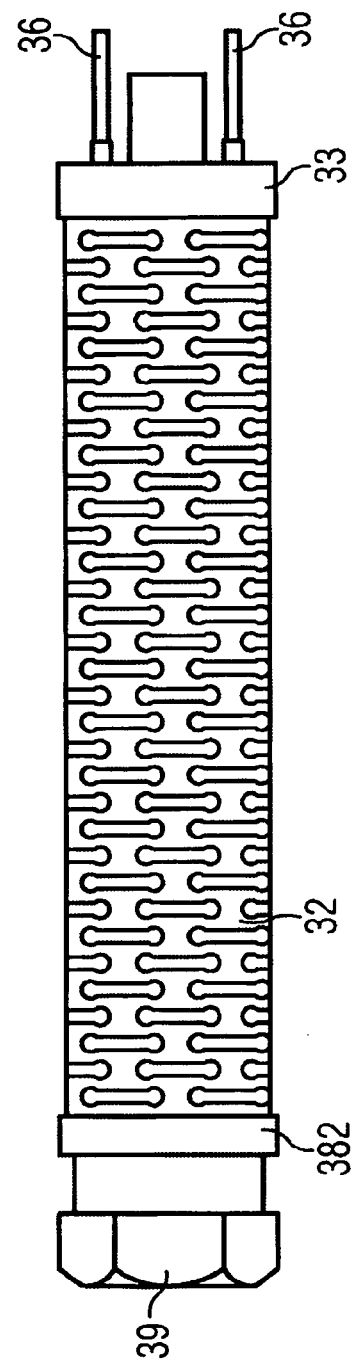
FIG 2A
FIG 2B

ACTUATOR UNIT AND METHOD FOR MANUFACTURING AN ACTUATOR UNIT

CROSS-REFERENCE TO RELATED APPLICATIONS

This application is a U.S. national stage application of International Application No. PCT/EP2004/052978 filed Nov. 16, 2004, which designates the United States of America, and claims priority to European application number EP03029640.4 filed Dec. 22, 2003, the contents of which are hereby incorporated by reference in their entirety.

TECHNICAL FIELD

The invention relates to an actuator unit with a tube spring and a piezoelectric actuator, that is inserted into the tube spring and is pretensioned by the tube spring.

BACKGROUND

Actuator units with a piezoelectric actuator are in widespread use and are more and more used for fuel injectors for internal combustion engines. They have the advantage of having very fast response timed actuating signals and therefore enable multiple injections into a cylinder of the internal combustion during one working cycle of the cylinder. Essential for a reliable operation of a fuel injector with an actuator unit with a piezoelectric actuator is, that the piezoelectric actuator is precisely pretensioned.

WO 00/08353 discloses an actuator unit with a tube spring, a piezoelectric actuator, that is inserted into the tube spring, a first cap, that is connected to the tube spring at a first free end of the tube spring and which is adjoined by the piezoelectric actuator and a second cap, that is connected to the tube spring at a second free end of the tube spring and which is also adjoined by the piezoelectric actuator. The first and second caps are welded to the tube spring. The tube spring is preferably made out of steel and has recesses that are formed in a bone-shaped manner. The piezoelectric actuator is pretensioned by the tube spring. The pretension forces are transmitted to the piezoelectric actuator by the first and second cap. The piezoelectric actuator is pretensioned with a force of 800 to 1000 Newton. When manufacturing the actuator unit the piezoelectric actuator needs to be inserted into the tube spring after the first cap is welded to the tube spring and before the second cap is welded to the tube spring. While welding the second cap to the tube spring the given pretension force must be applied to the second cap. This means that a tool needs to contact the second cap in a respective manner.

SUMMARY

The object of the invention is to create an actuator unit and a method for manufacturing an actuator unit, which is simple and at the same time cheap to manufacture.

The object can be achieved by an actuator unit comprising a tube spring, a piezoelectric actuator, that is inserted into the tube spring, a first cap, that is connected to the tube spring at a first free end of the tube spring and which is adjoined by the piezoelectric actuator, a tube-shaped body, that is connected to the tube spring by joining and is arranged in the area of a second free end of the tube spring, and a means for pretensioning, that is supported by the tube-shaped body and pretensions the piezoelectric actuator.

The actuator may further comprise a body, that comprises a disc-shaped part, which is inserted into the tube spring between the piezoelectric actuator and the tube-shaped body and which is influenced by the means for pretensioning. The body can be a bolt-shaped body. The actuator unit may further comprise a thread in the tube-shaped body, and wherein the pretensioning means is a screw that is screwed into the thread. The bolt-shaped body can be spherically shaped on its shaft side. The tube-shaped body may have a jump in its diameter on its outer circumference. The tube-shaped body can be joined to the tube spring by welding.

The object can also be achieved by a method for manufacturing an actuator unit, comprising the steps of joining a first cap with a tube spring on a first free end of the tube spring, inserting a piezoelectric actuator into the tube spring, arranging a tube-shaped body in the area of a second free end of the tube spring and connecting the tube spring by joining and inserting a pretensioning means, that is supported by the tube-shaped body and pretensions a piezoelectric actuator.

After inserting the piezoelectric actuator into the tube spring a body can be inserted, that comprises a disc-shaped part, into the tube spring from the side of the second free end.

The invention is distinguished by an actuator unit with a tube spring, a piezoelectric actuator, that is inserted into the tube spring, a first cap, that is connected to the tube spring at a first free end of the tube spring and which is adjoined by the piezoelectric actuator, a tube-shaped body, that is connected to the tube spring by joining and is arranged in the area of a second free end of the tube spring, and a means for pretensioning, that is supported by the tube-shaped body and pretensions the piezoelectric actuator. This has the advantage that the joining of the tube-shaped body can be done without the piezoelectric actuator being pretensioned. This enables very good access for the joining tools as there is no need for another tool that applies a pretension force to the piezoelectric actuator while welding the tube-shaped body to the tube spring. The given pretension can then be adjusted after joining the tube-shaped body to the tube spring which makes it easier to set the pretension to a given level.

In an advantageous embodiment of the invention the actuator unit comprises a body, that comprises a disc-shaped part, which is inserted into the tube spring between the piezoelectric actuator and the tube-shaped body and which is influenced by the means for pretensioning. This has the advantage, that the force exerted by the means for pretensioning, is led consistently over the surface of the disc-shaped part to the piezoelectric actuator.

It is very advantageous, if the body is formed as a bolt-shaped body, because such parts are cheaply available.

In a further advantageous embodiment of the actuator unit there is a thread in the tube-shaped body and the pretensioning means is a screw, that it is screwed into the thread. This has the advantage, that the pretension can be set precisely without much effort. A further advantage is, that bolts are widely and cheaply available.

In a further advantageous embodiment of the actuator unit the bolt is spherically shaped on its shaft side. This has the advantage that the parts need to be less precisely manufactured and a precise setting of the pretension is still possible.

In a further advantageous embodiment of the actuator unit the tube-shaped body has a jump in its diameter on its outer circumference. This has the advantage, that the tube-shaped body can easily be positioned in the tube spring.

In a further advantageous embodiment of the actuator unit the tube-shaped body is joined to the tube spring by welding.

The object of the invention concerning the method for manufacturing an actuator unit is achieved by a method for manufacturing an actuator unit, which comprises the steps of joining a first cap with a tube spring on a first free end of the tube spring, inserting a piezoelectric actuator into the tube spring, arranging a tube-shaped body in the area of a second free end of the tube spring and connecting the tube spring by joining and inserting a pretensioning means, that is supported by the tube-shaped body and pretensions the piezoelectric actuator. This method has the advantage, that the joining of the tube-shaped body can be done without applying a pretensioning force to the piezoelectric actuator and therefore there is no necessity to position respective tools during the welding process. This gives better access for the welding tool. The pretension force can be adjusted afterwards while inserting the pretensioning means which makes it easy to set the pretension at a given level. These features enable the actuator unit to be assembled in a cheap way while getting a reliable actuator unit.

In an advantageous embodiment of the method, after inserting the piezoelectric actuator in the tube spring a body is inserted, that comprises a disc-shaped part, into the tube spring from the side of the second free end. The disc-shaped part enables, that the force exerted by the means for pretensioning is consistently led over the surface of the disc-shaped part of the piezoelectric actuator.

BRIEF DESCRIPTION OF THE DRAWINGS

Exemplary embodiments of the invention are explained in the following with the aid of schematic drawings. These are as follows.

Elements of the same design and function that occur in different illustrations are identified by the same reference character.

DETAILED DESCRIPTION

Figure 1:
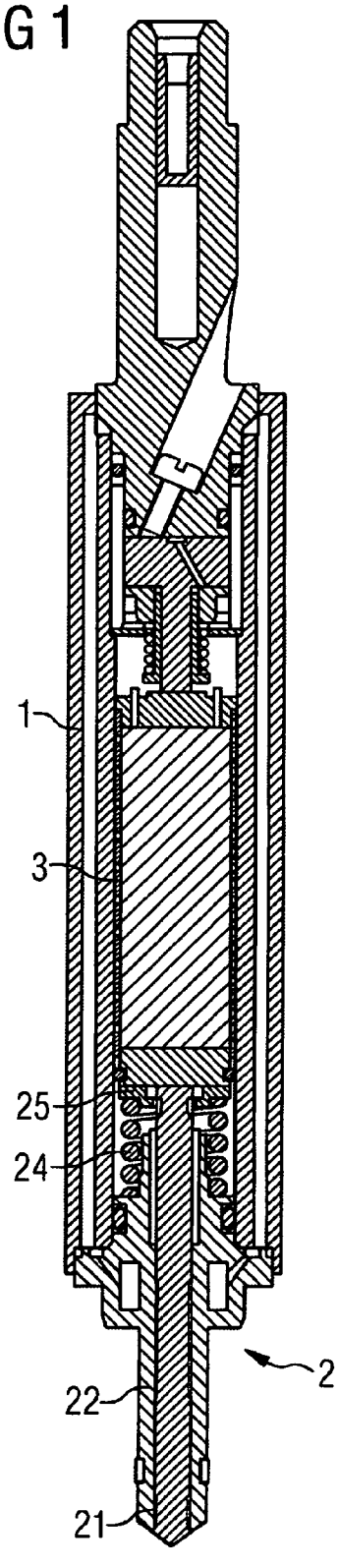
FIG. 1 a fuel injector with an actuator unit,
FIG. 2A a cut through an actuator unit,
FIG. 2B the actuator unit according to FIG. 2A,
FIG. 3A a first step for assembling the actuator unit,
FIG. 3B a second step for assembling the actuator unit,
FIG. 3C a third step for assembling the actuator unit,
FIG. 3D a fourth step for assembling the actuator unit,
FIG. 3E a fifth step for assembling the actuator unit, and
FIG. 4 a second embodiment of the actuator unit.

A fuel injector, that is suitable for injecting fuel into a gasoline engine or that may also be suitable for injecting fuel into a diesel engine, comprises a housing 1, a valve body 2 and an actuator unit 3. The fuel injector is preferably located in a cylinder head of an internal combustion engine and provides a combustion chamber with fuel. The housing may be double-tube shaped, whereby in the space between the walls of the double tube the fuel is led to the valve body.

The valve body 2 comprises a needle 21 that is guided in the valve body in the area of a guide 22. The needle is of an outward opening type, but it may also be of an inward opening type. The needle 21 is pushed in its closed position by a return spring 24, which sits on a spring washer 25, that is connected to the needle 21. The return spring 24 exerts a force on the needle 21 in the closing direction of the needle 21.

The needle 21 is coupled to the actuator unit 3. Depending on actuating signals the actuator unit 3 changes its axial length and thereby pushes the needle 21 in its open position or leaves it in its closed position. The actuator unit 3 comprises a piezo actuator 31 that is inserted in a tube spring 32, which pretensions the piezo actuator 31 with a given force of preferably 800 to 1000 Newton. A thermal compensator may be coupled with the actuator unit 3 and the housing 1 in order to compensate different thermal lengthening coefficients of the housing 1 and the actuator unit 3.

The actuator unit 3 (FIG. 2A, FIG. 2B) comprises the tube spring 32 which is preferably made out of steel and comprises various recesses that are formed in a bone-shaped manner. The tube spring needs to be made out of a material and to be formed in a way that it can uphold the pretension and is also flexible enough for the further axial lengthening of the piezo actuator 31. The actuator unit 3 further comprises a first cap 33, that is joined to the tube spring 32 at a first free end 34 of the tube spring 32. The first cap 33 has recesses into which contact pins 36 are inserted and are electrically contacted to electrodes of the piezo elements of the piezo actuator 31. The piezo actuator 31 comprises a stack of piezo elements.

Preferably the first cap 33 is welded to the tube spring 32 at the first free end 34. The piezo actuator 31 joins the first cap 33 from the inside of the tube spring 32. On the second free end 35 of the tube spring 32 a tube-shaped body 38 is joined to the tube spring 32, preferably by welding. However it may be joined to the tube spring in another way known by a person skilled in the art. The tube-shaped body 38 is pushed into the tube spring 32 and rests on the second free end 35 of the tube spring 32 on a jump 381 in the diameter of the tube-shaped body 38. The jump 381 in the diameter is, for example, achieved by a ring-shaped protrusion 382 of the tube-shaped body 38. This makes it easy to position the tube-shaped body 38 within the tube spring 32 and makes a precise and durable welding possible.

Between the piezo actuator 31 and the tube-shaped body 38 a body 37 is located in the tube spring 32. The body 37 comprises a disk-shaped part 371 and a shaft part and in this way forms a bolt-shaped body. Between the tube-shaped body 38 and the piezo actuator 31 the disc shaped part 371 may be arranged with an axial play.

A bolt 39 is screwed into the tube-shaped body 38 which comprises a respective thread 383. Depending on how far the bolt 39 is screwed into the thread 383 a pretension force is exerted on the piezo actuator 31 via the body 37. Therefore the pretension force can be easily adjusted. The bolt 39 may be spherically shaped on its shaft side.

Figure 3A:
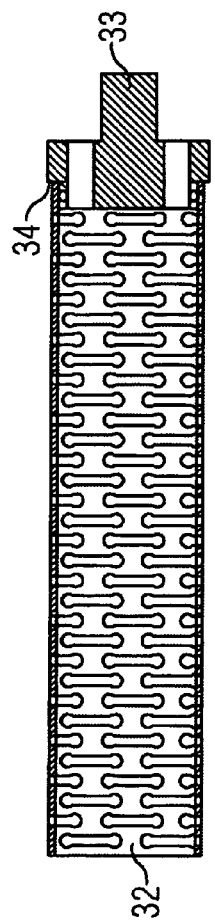
Figure 3B:
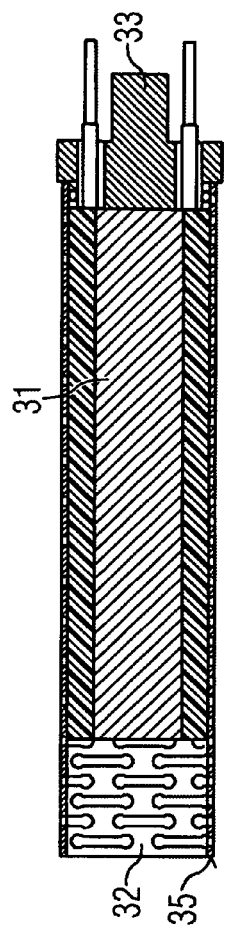
Figure 3C:
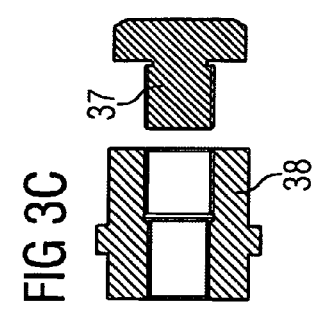
Figure 3D:
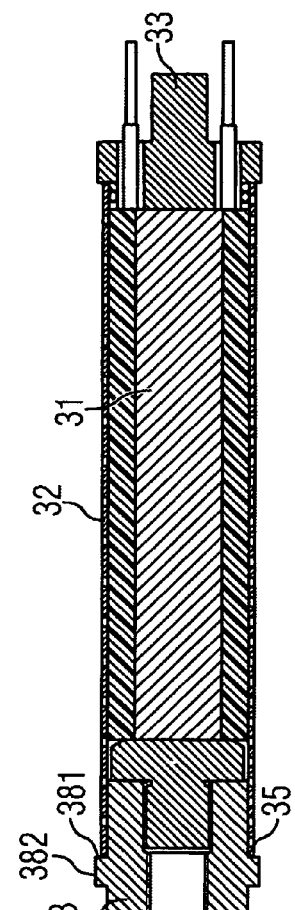
Figure 3E:
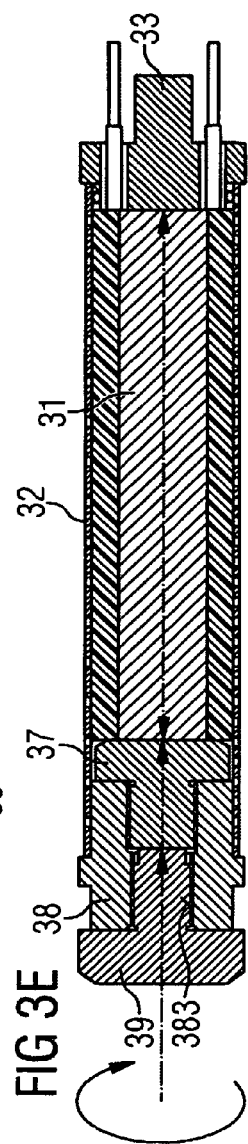

The assembly process of the actuator unit is described in the following with the help of FIGS. 3A to 3E. FIG. 3A shows a first assembly step of the actuator unit 3. The first cap 33 is joined to the tube spring 32 at its first end 34, preferably by welding, e.g. by laser-welding. In the next assembly step (FIG. 3B) the piezo actuator 31 is inserted into the tube spring 32 from its second free end 35 until it adjoins the first cap 33.

In the next step (FIG. 3C) the body 37, which is bolt-shaped is inserted with its shaft into the tube-shaped body 38 and the two parts are then pushed into the tube spring 32 until the tube-shaped body 38 rests with its jump in diameter 381 on the second free end 35 of the tube spring 32. The tube-shaped body 38 is then joined to the tube spring 32, preferably by laser-welding.

In the next step (FIG. 3E) a bolt 39 is screwed into a thread 383 of the tube-shaped body 38. The bolt 39 is screwed into thread 383 until the exerted force on the piezo actuator 31 reaches a given value. In order to keep the bolt 39 in its exact position after that, it may be welded or soldered to the tube-shaped body 38.

Figure 4:
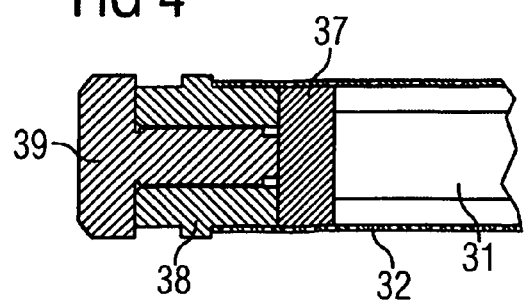

FIG. 4 shows a second embodiment of the actuator unit 3, only the relevant parts are shown in FIG. 4. In this embodiment the body 37 consists only of the disk-shaped part, the bolt 39 has a shaft that is long enough to contact one of the surfaces of the body 37 and it exerts by that a respective force on the body 37 which transmits it to the piezo actuator 31. In a simple embodiment of the actuator unit 3 the shaft of the bolt 39 may directly contact the piezo actuator 31.

What is claimed is:

1. An actuator unit comprising: a tube spring, a piezoelectric actuator, that is inserted into the tube spring, a first cap, that is connected to the tube spring at a first free end of the tube spring and which is adjoined by the piezoelectric actuator, a tube-shaped body, that is connected to the tube spring by joining and is arranged in the area of a second free end of the tube spring, a means for pretensioning the piezoelectric actuator after the tube spring is connected to the first cap and the tube-shaped body, the means for pretensioning being supported by the tube-shaped body and pretensions the piezoelectric actuator by physically compressing the piezoelectric actuator but not the tube spring and comprising a thread in the tube-shape body, wherein the pretensioning means is a screw that is screwed into the thread.

2. An actuator unit according to claim 1, comprising a body, that comprises a disc-shaped part, which is inserted into the tube spring between the piezoelectric actuator and the tube-shaped body and which is influenced by the means for pretensioning.

3. An actuator unit according to claim 2, wherein the body is a bolt-shaped body.

4. An actuator unit according to claim 3, wherein the bolt-shaped body is spherically shaped on its shaft side.

5. An actuator unit according to claim 1, wherein the tube-shaped body has a jump in its diameter on its outer circumference.

6. An actuator unit according to claim 1, wherein the tube-shaped body is joined to the tube spring by welding.

7. An actuator unit comprising: a tube spring comprising a piezoelectric actuator, a first cap connected to the tube spring at a first free end of the tube spring, a tube-shaped body, that is connected to the tube spring and is arranged in the area of a second free end of the tube spring, a piezoelectric actuator pretensioning device supported by the tube shaped body, the piezoelectric actuator pretensioning device configured to pretension the piezoelectric actuator, after the tube spring is connected to the first cap and the tube-shaped body, by physically compressing the piezoelectric actuator but not the tube spring and comprising a thread in the tube-shape body, wherein the pretensioning means is a screw that is screwed into the thread.

8. An actuator unit according to claim 7, comprising a body, that comprises a disc-shaped part, which is inserted into the tube spring between the piezoelectric actuator and the tube-shaped body and which is influenced by the piezoelectric actuator pretensioning device.

9. An actuator unit according to claim 8, wherein the body is a bolt-shaped body.

10. An actuator unit according to claim 9, wherein the bolt-shaped body is spherically shaped on its shaft side.

11. An actuator unit according to claim 7, wherein the tube-shaped body has a jump in its diameter on its outer circumference.

12. An actuator unit according to claim 7, wherein the tube-shaped body is joined to the tube spring by welding.

\* \* \* \* \*